United States Patent

Hayafuji et al.

[11] Patent Number: 5,998,823
[45] Date of Patent: *Dec. 7, 1999

[54] COMPLEX DIELECTRIC FILM AND SEMICONDUCTOR DEVICE

[75] Inventors: Yoshinori Hayafuji, Kanagawa; Seiji Hayashida, Tokyo, both of Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/868,965

[22] Filed: Jun. 5, 1997

[30] Foreign Application Priority Data

Jun. 6, 1996  [JP]  Japan ................................. 8-166889

[51] Int. Cl.$^6$ .................... H01L 27/108; H01L 29/76; H01L 29/84; H01L 31/119
[52] U.S. Cl. ........................................... 257/306; 257/310
[58] Field of Search ................... 257/306, 310, 257/38, 22

[56] References Cited

U.S. PATENT DOCUMENTS

5,682,041  10/1997  Kawakubo et al. .
5,854,734  12/1998  Sandha et al. .

*Primary Examiner*—Stephen D. Meier
*Attorney, Agent, or Firm*—Hill & Simpson

[57] ABSTRACT

A complex dielectric film formed as an insulation film between oppositely facing conductors is made of an insulator and a non-insulator. The insulator and the non-insulator are formed to align in series in a serial model, to contain the non-insulator in the insulator in a serial-parallel model, and to align in parallel in a parallel mode 1. The insulator may be $SiO_2$, $Si_3N_4$, or other like material, and the non-insulator may be a metal, semi-metal, semiconductor containing conduction electrons, organic material containing conduction electrons, or other like material. The volume ratio of the non-insulator is chosen to an appropriate value in accordance with the designed value of the effective dielectric constant.

40 Claims, 8 Drawing Sheets

COMPLEX DIELECTRIC FILM AND SEMICONDUCTOR DEVICE

BACKGROUND OF THE INVENTION

1. Field of the Invention

This invention relates to a complex dielectric film and a semiconductor device especially suitable for use in high-integrated, high-density semiconductor integrated circuit devices.

2. Description of the Prior Art

A basic two-layered wiring structure used in a conventional semiconductor integrated circuit device is explained with reference to a schematic diagram of FIG. 1.

Figure 1:
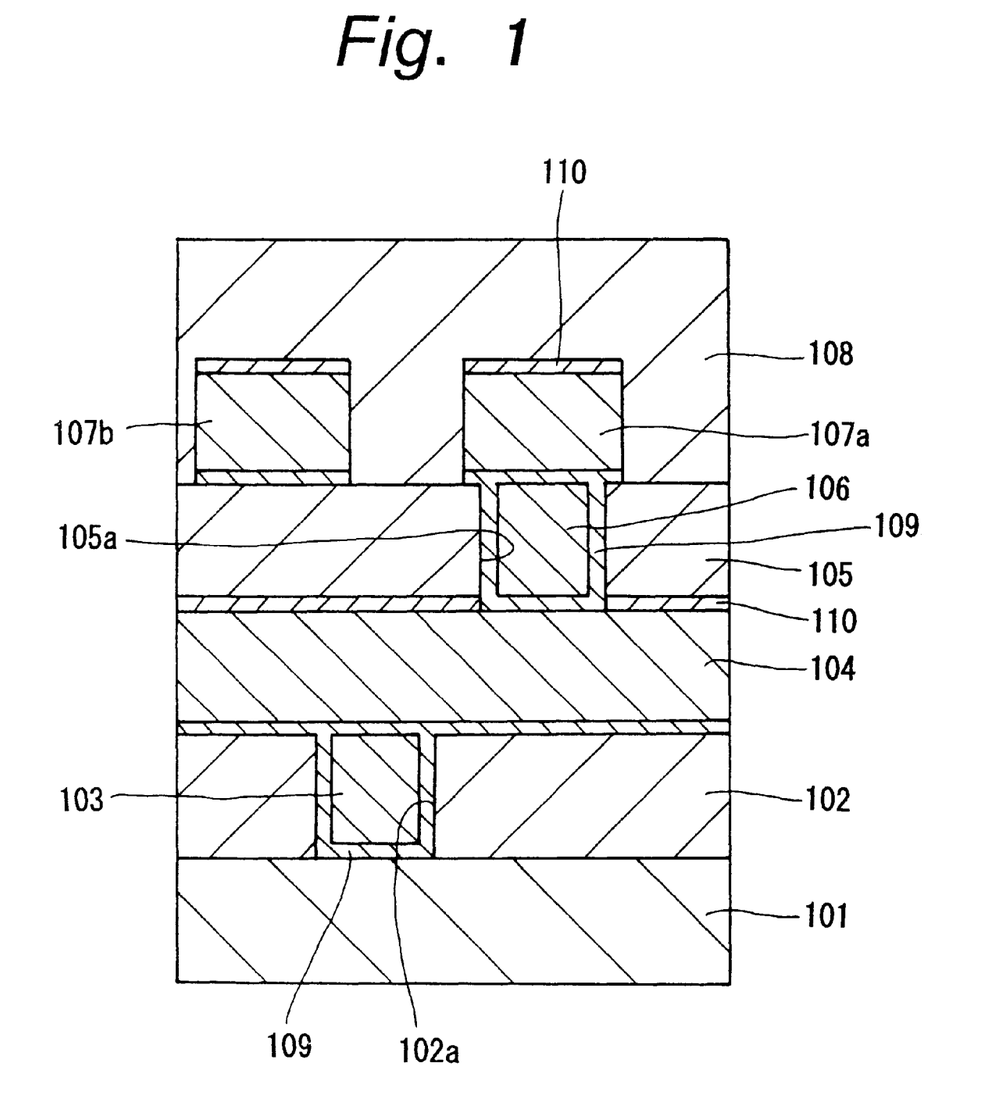
FIG. 1 is a cross-sectional view showing a conventional semiconductor integrated circuit device.

As shown in FIG. 1, in the conventional semiconductor integrated circuit device, a first inter-layer insulation film 102 is formed on a silicon substrate 101. The first inter-layer insulation film 102 has a contact hole 102a at a predetermined portion, and a first plug 103 is embedded in the contact hole 102a. The first plug 103 is connected to a diffusion layer (not shown) formed in a selective portion of the silicon substrate 101 aligned with the contact hole 102a. A first wiring layer 104 overlies the first plug 103 and the first inter-layer insulation film 102. The first wiring layer 104 is connected to the first plug 103, and covered by a second inter-layer insulation film 105. The second inter-layer insulation film 105 has a contact hole 105a at a predetermined portion, and a second plug 106 is embedded in the contact hole 105a. A second wiring layer 107a is formed on the second plug 106, and another second wiring layer 107b is formed in a close relation with the second wiring layer 107a on the second inter-layer insulation film 105. A third inter-layer insulation film 108 overlies the second wiring layers 107a and 107b.

A barrier metal 109 underlies the first wiring layer 104, second wiring layers 107a, 107b, first plug 103 and second plug 106, and an anti-reflection film 110 overlies the first wiring layer 104 and the second wiring layers 107a, 107b.

The semiconductor integrated circuit device shown in FIG. 1 is manufactured in a process explained below. First formed on the entire surface of the silicon substrate 101 is the first inter-layer insulation film 102 by chemical vapor deposition(CVD) or physical vapor deposition(PVD). After that, the contact hole 102a is made by patterning the first inter-layer insulation film 102 by lithography and etching. Next, the first plug 103 is embedded in the contact hole 102a. Then, a conductive film for making the wiring layer is formed on the entire surface in the same manner as used before, and the first wiring layer 104 is formed by patterning the conductive film by using the same techniques. After that, the second inter-layer insulation film 105 is formed on the entire surface by the same method, and then patterned to make the contact hole 105a using the same technique. Then, the second plug 106 is embedded in the contact hole 105a. After that, another conductive film for making the wiring layer is formed on the entire surface by the same method, and then patterned to make the wiring layers 107a, 107b by the same technique. After that, the third inter-layer insulation film 108 is formed on the entire surface in the same manner. Explanation is omitted on formation of the barrier metal 109 and the anti-reflection film 110.

In this manner, by repeating the process of depositing an inter-layer insulation film, patterning the insulation film, depositing a conductive film for making a wiring layer, and patterning the conductive film, a two-layered wiring structure is made.

An essential feature of the wiring structure used in the conventional semiconductor integrated circuit device shown in FIG. 1 lies in that, paying a particular attention to the second wiring layers 107a, 107b in a face-to-face arrangement, the third inter-layer insulation film 108, typically made of a silicon oxide ($SiO_2$) material, is formed to fill the gap between the second wiring layers 107a, 107b.

Although the semiconductor integrated circuit device shown in FIG. 1 has a two-layered wiring structure, current technologies are developing semiconductor integrated circuit devices having a five to six-layered wiring structures for higher-integrated and higher-density devices.

Along with a progress in higher-integration and higher-density of semiconductor integrated circuit devices, elements and areas or regions of the devices become more and more micro-sized and close-located. Resulting problems are explained below, taking a semiconductor integrated circuit device having a three-layered wiring structure shown in FIG. 2 where identical or equivalent parts or elements as those of the semiconductor integrated circuit device shown in FIG. 1 are labelled with common reference numerals. Numerals 1071, 107b, 107c denote second wiring layers, 111 a third wiring layer, and 112 a fourth inter-layer insulation film.

Figure 2:
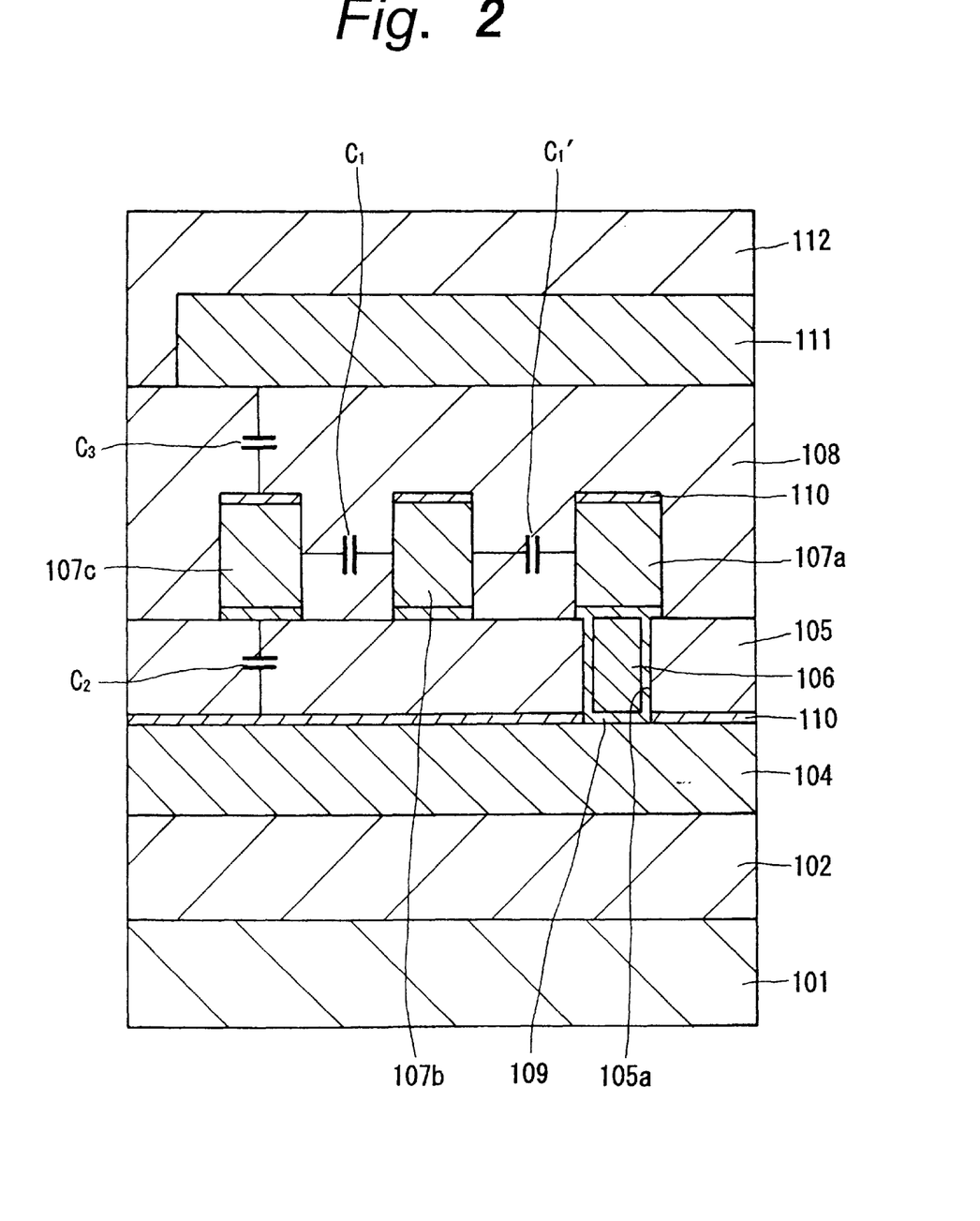
FIG. 2 is a cross-sectional view for explaining problems involved in the conventional semiconductor integrated circuit device.

As shown in FIG. 2, as high integration and high density of semiconductor integrated circuit devices progress, distances among the second wiring layers 107a, 107b, 107c decreases. Due to this, inter-wiring capacitances $C_1$, $C_1'$ increase, and this causes a delay of transmission of electric signals among the second wiring layers 107a, 107b, 107c due to their capacitance-resistance coupling. Moreover, an increase in inter-wiring capacitances $C_2$, $C_3$ occurs also among the first wiring layer 104, second wiring layers 107a, 107b, 107c, and third wiring layer 111 due to their decreased distances, cross-talk or other interference of electric signals occurs among these wiring layers.

These undesirable phenomena can be partly overcome by using improvements disclosed in Japanese Patent Laid-Open Nos. 57-190331 and 63-179548 which propose an open hole (or an open hollow) to the wiring layers, or by using an aerial wiring disclosed in Japanese Patent Laid-Open Nos. 56-19636 and 57-43444. In the conventional wiring structure shown in FIG. 2, such problems can be partly overcome also by using special materials for making the first inter-layer insulation film 102, second inter-layer insulation film 105 and third inter-layer insulation film 108, which have smaller dielectric constants than that of $SiO_2$ conventionally used as the material of inter-layer insulation films, namely, silicon boron nitride (SiBN), oxy-fluoride silicon (SiOF) and polyimide fluoride which are disclosed in Japanese Patent Laid-Open Nos. 62-156822, 2-77127 and 4-328126 as materials for improving conventional techniques. However, for higher-integrated and higher-density semiconductor integrated circuit devices, the problems cannot be removed sufficiently by the existing approaches, either using the improved architecture or using special materials.

OBJECTS AND SUMMARY OF THE INVENTION

It is therefore an object of the invention to provide a complex dielectric film which can decrease the effective dielectric constant to a value as sufficiently small as 0 to 2 in absolute value, approximately, while maintaining reliable insulation between conductors such as wiring layers.

Another object of the invention is to provide a semiconductor device which can decrease the capacitance between conductors, such as wiring layers, to a sufficiently small value, while maintaining reliable insulation between conductors such as wiring layers.

According to an aspect of the invention, there is provided a complex dielectric film used as an insulation film between a plurality of conductors in a face-to-face arrangement, comprising:
an insulator; and
a non-insulator.

According to another aspect of the invention, there is provided a semiconductor device including a complex dielectric film as an insulation film between a plurality of conductors in a face-to-face arrangement, comprising:
the complex dielectric film being made of an insulator and a non-insulator.

The insulator and the non-insulator may be formed to extend in a serial or parallel arrangement between the conductors. Alternatively, the non-insulator may be contained in the insulator.

The insulator forming the complex dielectric film may be a metal or a semi-metal. The metal or semi-metal may be in form of a thin film which may form superlattices of the metal or semi-metal film and the insulator. Alternatively, the metal or semi-metal may be distributed as particles in the insulator or in form of clusters in the insulator.

The non-insulator forming the complex dielectric film may be a semiconductor, in particular, containing conduction electrons. The semiconductor may be in form of a thin film which may form superlattices of the metal or semi-metal film and the insulator. Alternatively, the semiconductor may be distributed as particles in the insulator or in form of clusters in the insulator.

The non-insulator forming the complex dielectric film may be molecules or polymers having conduction electrons. The molecules or polymers may form a thin film which may form superlattices of a film of the insulator and the molecules or polymers. Alternatively, the molecules or polymers may be distributed as particles in the insulator or as molecules or polymers in the insulator.

The non-insulator forming the complex dielectric film may be an organic material. The organic material may form a thin film which may form superlattices of a film of the insulator and the organic material. Alternatively, the organic material may be distributed as particles in the insulator or as molecules in the insulator.

The complex dielectric film preferably has an effective dielectric constant of 2 or less in absolute value.

According to the invention having the above construction, since the non-insulator, such as metal, semi-metal, semiconductor having conduction electrons, organic material having conduction electrons, has a negative dielectric constant while the insulator has a positive dielectric constant, the effective dielectric constant can be decreased as small as 0 to 2 in absolute value, for example, by appropriately determining the volume ratio of the non-insulator in the complex dielectric film. Therefore, when the complex dielectric film is used as an insulation film between conductors, the capacitance between the conductors, e.g. wiring layers, for example, can be decreased sufficiently. Moreover, the insulator forming the complex dielectric film can maintain reliable insulation between the conductors.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Some embodiments of the invention are described below with reference to the drawings. In all figures illustrating the embodiments, identical or equivalent parts or elements are labelled with common reference numerals.

In the explanation made below, the dielectric constant of each component material of the complex dielectric film (element) is called "dielectric constant", directly, and the dielectric constant of the complex dielectric film is called effective dielectric constant.

Figure 3:
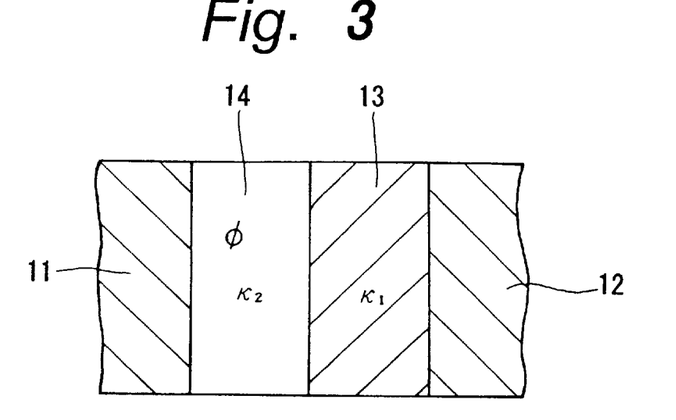
FIG. 3 is a schematic diagram showing a complex dielectric film according to a serial model.
Figure 4:
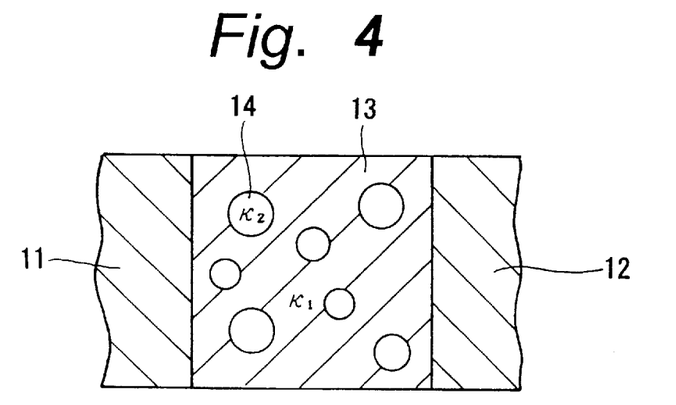
FIG. 4 is a schematic diagram showing a complex dielectric film according to a serial-parallel model.
Figure 5:
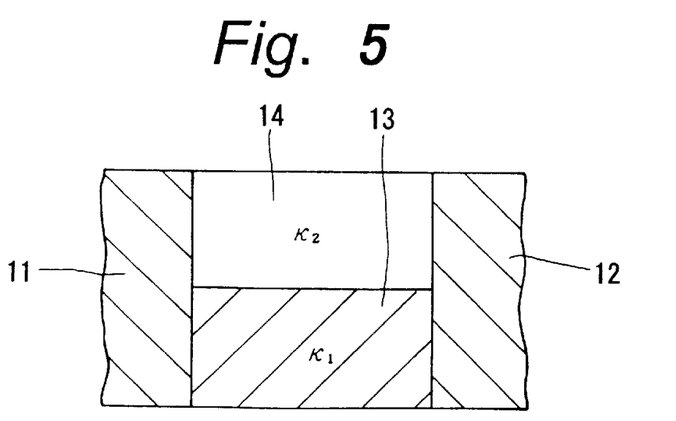
FIG. 5 is a schematic diagram showing a complex dielectric film according to a parallel model.

Assume here the complex dielectric film is made of two kinds of materials. FIGS. 3, 4 and 5 show typical three complex dielectric films. In FIGS. 3, 4 and 5, reference numerals 11 and 12 denote conductors (for example, wiring layers) in a face-to-face arrangement, and 13 and 14 denote different element materials forming the complex dielectric film. In FIGS. 3, 4 and 5, $\kappa_1$ and $\kappa_2$ are dielectric constants of the element materials 13 and 14, respectively. φ is the volume ratio of the element material 14 whose dielectric constant is $\kappa_2$.

The arrangement of FIG. 3 is an example where the element materials 14 and 13 extend in parallel with side walls of the conductors 11 and 12, and the element materials 14 and 13 are in a serial connection between the conductors 11 and 12. This is called a serial model hereafter. The effective dielectric constant K of the complex dielectric film according to the serial model formed between the conductors 11 and 12 can be expressed by Equation (1) shown below.

$$1/\kappa=(1-\phi)/\kappa_1+\phi/\kappa_2 \qquad (1)$$

The arrangement of FIG. 4 is an example where the element material 14 is contained in the other element material 13 between the conductors 11 and 12, and the element materials 13 and 14 are provided both in series and in parallel between the conductors 11 and 12. This is called a serial-parallel model hereafter. The effective dielectric constant κ of the complex dielectric film by the serial-parallel model formed between the conductors 11 and 12 can be expressed by Equation (2) shown below.

$$\kappa = \{2\kappa_1 + \kappa_2 - 2\phi(\kappa_1 - \kappa_2)\}\kappa_1/\{2\kappa_1 + \kappa_2 + \phi(\kappa_1 - \kappa_2)\} \quad (2)$$

The arrangement of FIG. 5 is an example where the element materials 13 and 14 are formed to extend between the conductors 11 and 12, and the element materials 13 and 14 extend in parallel between the conductors 11 and 12. This is called a parallel model hereafter. The effective dielectric constant κ of the complex dielectric film by the parallel model formed between the conductors 11 and 12 can be expressed by Equation (3) shown below.

$$\kappa = (1-\phi)\kappa_1 + \phi\kappa_2 \quad (3)$$

A major condition required for Equations (1) to (3) is that the outstanding field is an electrostatically induced field where induced charges do not vary with time. These equations are approximately established also in a quasi-electrostatically induced field described in a document entitled "Electrostatic Induction" by Masatoshi Nakayama (Kyoritsu Shuppan, Tokyo, 1985, p.78).

Figure 6:
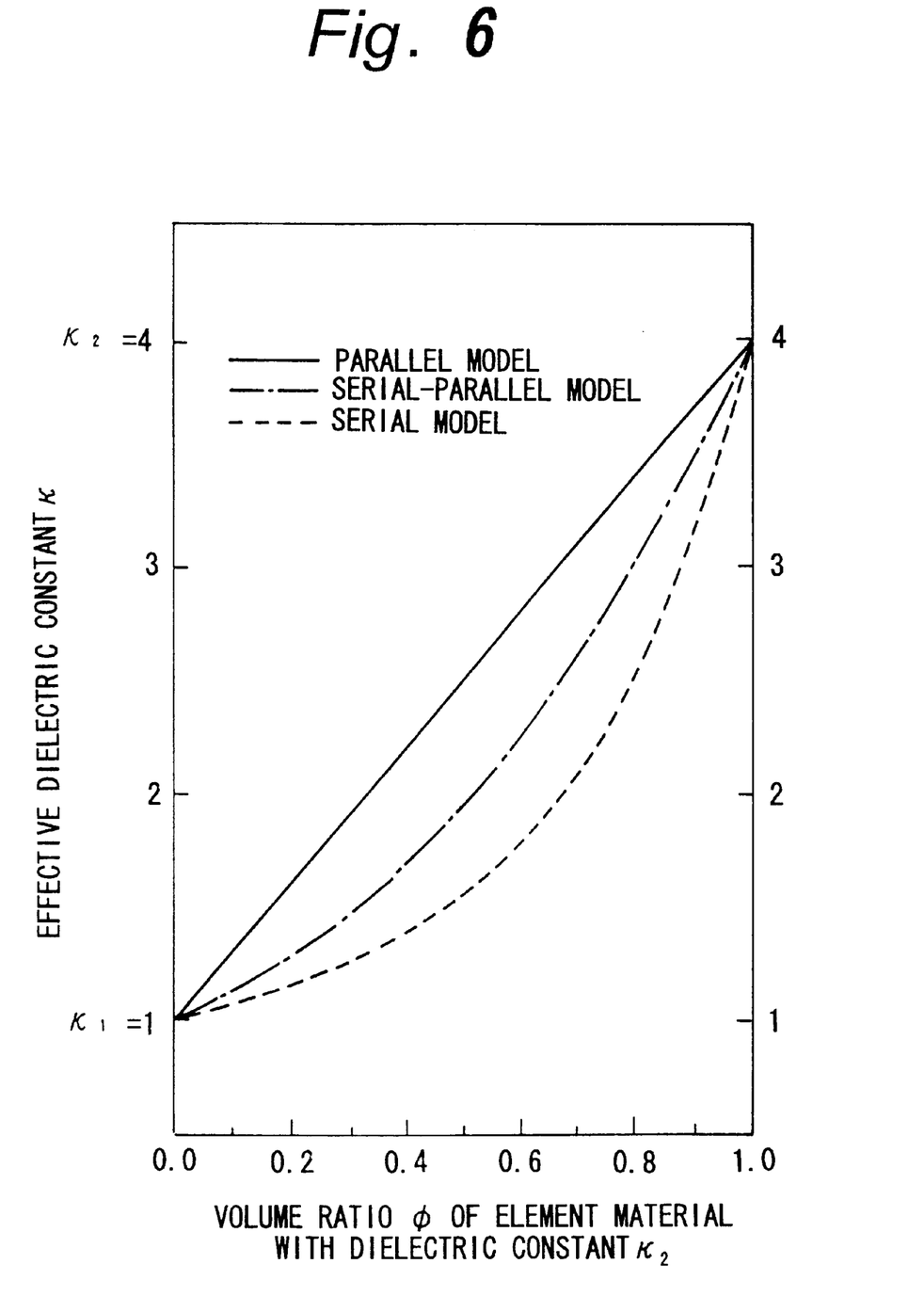
FIG. 6 is a schematic diagram showing relations between effective dielectric constants κ of complex dielectric films and volume ratios φ of element materials having the dielectric constant $\kappa_2$ in serial, serial-parallel and parallel models.

FIG. 6 shows effective dielectric constants κ of the complex dielectric films between the conductors 11 and 12 by the serial model, serial-parallel model and parallel model shown in FIGS. 3, 4 and 5. FIG. 6 shows effective dielectric constants κ along the vertical axis and volume ratios φ along the horizontal axis. Values of FIG. 6 are those obtained from examples using ideal vacuum as the element material 13 and $SiO_2$ as the element material, and using the dielectric constant of the element material 13 $\kappa_1=1$ and the dielectric constant of the element material $\kappa_2=4$.

Apparent from FIG. 6, since the dielectric constant $\kappa_1$ of the element material 13 is 1 while the dielectric constant $\kappa_2$ of the element material 14 is 4, the effective dielectric constant K of the complex dielectric film is in the range between 1 to 4 either in the serial model, serial-parallel model or parallel model, and never becomes smaller. The same applies also to all complex dielectric films having the conventional structure where both element materials 13, 14 are insulators with dielectric constants $\kappa_1$ and $\kappa_2$ not less than 1. That is, in complex dielectric films having the conventional structure, it is impossible to decrease the effective dielectric constant κ below 1.

Thus, the embodiment of the invention uses an insulator having a positive dielectric constant $\kappa_1$ as the element material 13, and uses a metal, semi-metal or semiconductor containing conduction electrons, having a negative dielectric constant $\kappa_2$ as the element material 14, to realize a complex dielectric film having an effective dielectric constant κ not larger than 2 in absolute value, or more preferably, having an effective dielectric constant κ very near to zero.

Consideration is made below about dielectric constants of insulators and dielectric constants of metals, semi-metals and semiconductors containing free electrons.

Dielectric Constants of Insulators

In insulators, electrons or ions bond to electron shells or balancing positions of ions with their harmonic forces or restoring forces. In a damped harmonic oscillator model, motion of an electron or ion under an externally applied field E can be expressed by Equation (4) shown below.

$$md^2r/dt^2 + m\eta dr/dt + m\omega_0^2 r = -eE \quad (4)$$

where m, e and r are the mass, charge and displacement of the electron or ion, η is the frictional force in motion of the electron or ion, and $\omega_0$ is the intrinsic oscillation frequency of the damped harmonic oscillator. Solution of Equation (4) can be obtained by determining as $E=E_0\exp(-i\omega t)$ as follows.

$$r = (-eE/m)/(\omega_0^2 - \omega^2) - i\eta\omega\} \quad (5)$$

Since polarization P is $P=-erN/V$ (where N/V is the number of oscillators per unit volume), the polarization P and the complex dielectric constant κ can be expressed by Equation (6) shown below in relation with Equation (6).

$$P = (e^2N/mV)E/\{(\omega_0^2-\omega^2)-i\eta\omega\} = (\kappa-1)E/4\pi \quad (6)$$

$$\kappa = 1 + (4\pi e^2N/mV)/(\omega_0^2-\omega^2)-i\eta\omega\} = \kappa_{re} + i\kappa_{im} \quad (7)$$

$$\kappa_{re} = 1 + (4\pi e^2N/mV)(\omega_0^2-\omega^2)/\{(\omega_0^2-\omega^2)^2+\eta^2\omega^2\} \quad (8)$$

$$\kappa_{im} = (4\pi e^2N/mV)\eta\omega/\{(\omega_0^2-\omega^2)^2+\eta^2\omega^2\} \quad (9)$$

Figure 7:
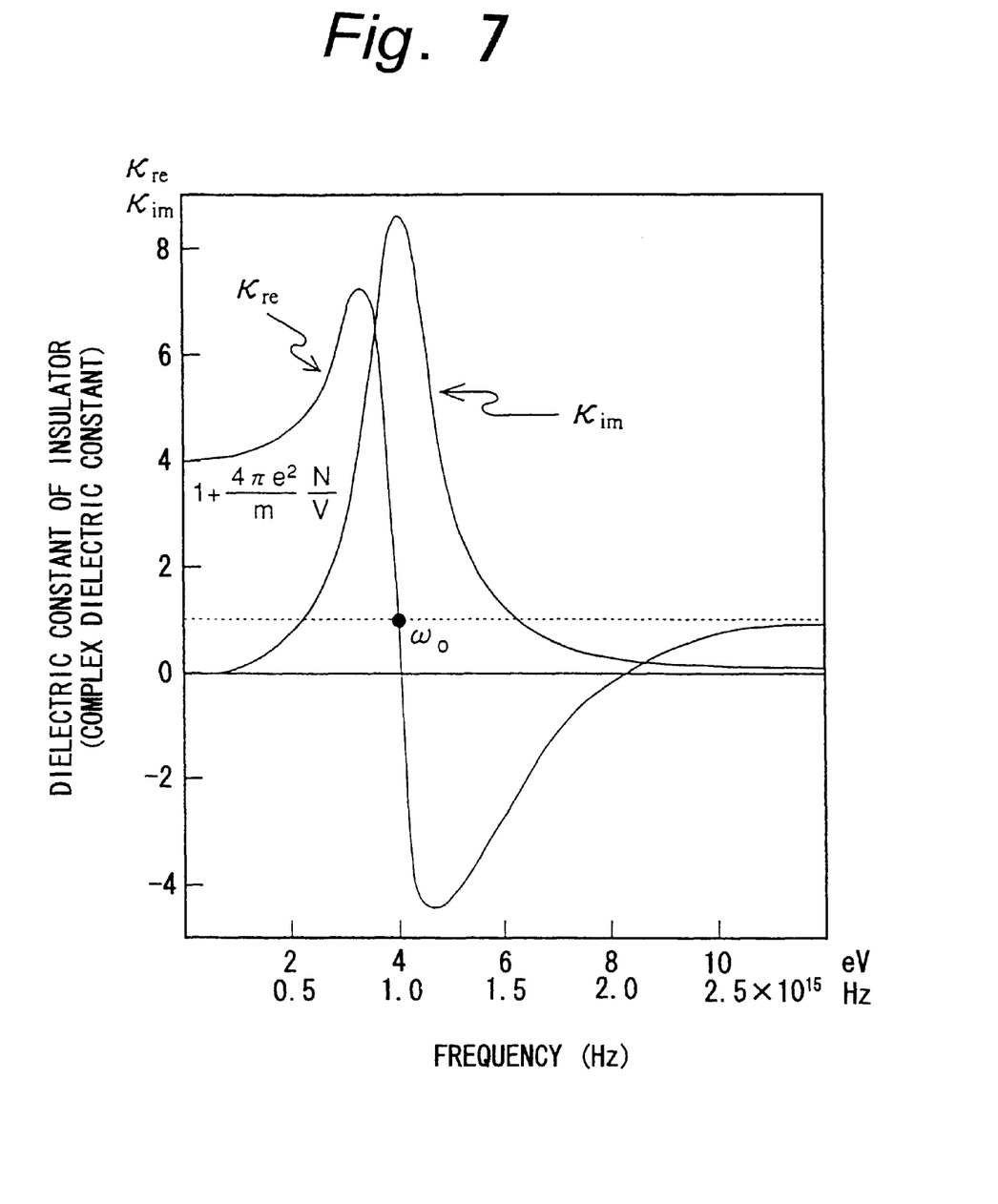
FIG. 7 is a schematic diagram showing the dependency of the dielectric constant of a metal upon the frequency of an external electric field.

Usually, $\omega_0$ of a dielectric body exhibits a value below approximately $10^6$ Hz, a value around $10^{12}$ Hz and a value around $10^{15}$ Hz, corresponding to harmonic oscillators of three kinds of polarization mechanisms in the dielectric body, namely, orientational polarization, ionic polarization and electronic polarization. In most cases, orientational polarization does not occur in $SiO_2$ and other materials prepared by adding other elements to $SiO_2$, which are used as materials of inter-layer insulation films of semiconductor integrated circuit devices. Dielectric materials with orientational polarization will never be used as materials of inter-layer insulation films even in a future. Thus, values around $10^{12}$ Hz and values around $10^{15}$ Hz are taken into consideration as values of $\omega_0$, corresponding to ionic polarization and electronic polarization of dielectric materials. Therefore, even if such semiconductor integrated circuit devices are used in the operation frequency $\omega=10^{10}$ Hz in a near future, since $(\omega_0^2-\omega^2)$ in Equation (8) is a positive number, the real part $\kappa_{re}$ of the complex dielectric constant κ is a positive number. FIG. 7 shows dependencies of $\kappa_{re}$ in Equation (8) and $\kappa_{im}$ in Equation (9) upon frequencies.

Dielectric Constants of Metals, Semi-metals and Semiconductors Containing Free Electrons Dielectric constants of metals, semi-metals and other materials containing free electrons such as semiconductors doped with a dopant are not described in damped harmonic oscillator models by harmonic forces or restoring forces of electrons or ions in insulators, but derive from Drude models treating electrons as free particles. Also for materials containing conduction electrons, their dielectric constants derive from Drude models dealing electrons as free particles approximately.

Under an externally applied field E, motion of a free electron is expressed by Equation (10) shown below.

$$m^*d^2r/dt^2 + (m^*/\tau)dr/dt = -eE \quad (10)$$

Figure 8:
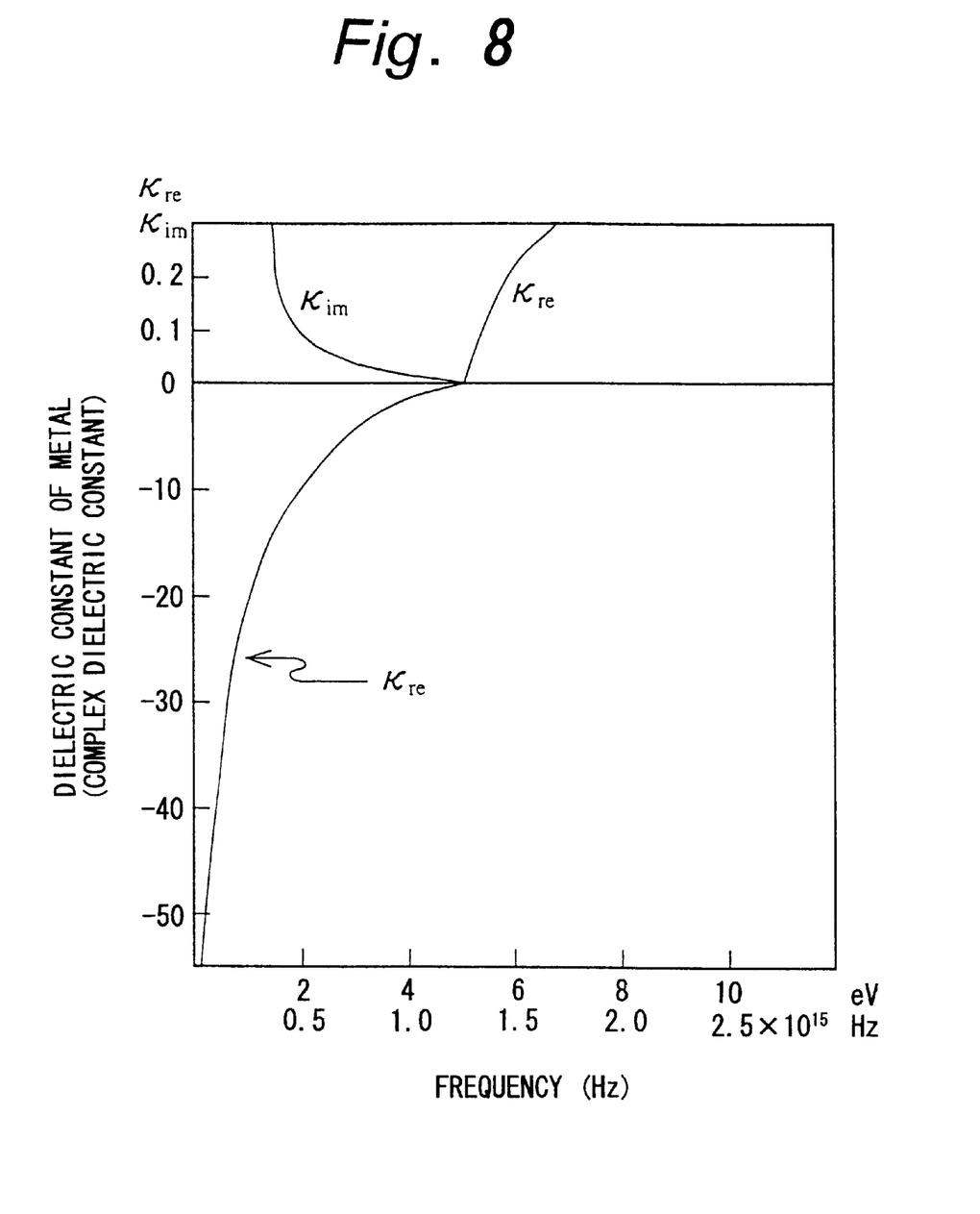
FIG. 8 is a schematic diagram showing the dependency of the dielectric constant of a metal upon the frequency of an external electric field.

Equation (10) derives from Equation (4), determining the intrinsic oscillation frequency $\omega=0$, and $\eta=1/\tau$, in accordance with the equation of motion of a damped harmonic oscillator in an insulator. $1/\tau$ is the probability of collision of a single electron in unit time, assuming that the electron moves freely in intervals between collisions. Therefore, τ is the mean free time. $m^*$ is the effective mass of the electron. Equation (19) can be solved in the same manner as Equation (4), and the complex dielectric constant κ can be expressed Equation (11) shown below.

$$\kappa = 1 - (4\pi e^2 N/m^*V)/(\omega^2 + i\omega/\tau) \quad (11)$$
$$= 1 - \omega_p^2/(\omega^2 + i\omega/\tau)$$
$$= \kappa_{re} + i\kappa_{im}$$

$$\kappa_{re} = 1 - \omega_p^2\tau^2/(1 + \omega^2\tau^2) \quad (12)$$

$$\kappa_{im} = \omega_p^2\tau/\omega(1 + \omega^2\tau^2) \quad (13)$$

where $\omega_p$ is the plasma oscillation frequency of a free electron, and $\omega_p^2 = 4\pi e^2 N/m^*V$. FIG. 8 shows dependencies of $\kappa_{re}$ in Equation (12) and $\kappa_{im}$ in Equation (13) upon frequencies.

Since conductivity $\sigma_0$ is $\sigma_0 = \tau e^2 N/m^*V$, the plasma oscillation frequency $\omega_p$ and the conductivity $\sigma_0$ have a relationship shown by Equation (14).

$$4\pi\sigma_0 = \omega_p^2\tau \quad (14)$$

Table 1 shows electron densities N/V, plasma oscillation frequencies $\omega_p$ of conduction electrons, mean free times $\tau$, and values of $\kappa_{re}$ in a range with sufficiently small $\omega_p$, $\tau$ and frequency $\omega$, of typical metals, semi-metals and semiconductor Si.

Table 1, dielectric constants of typical metals are on the order of $-10^5$, dielectric constants of semi-metals are on the order of $-10^3$ to $-10^5$, and dielectric constants of highly-doped semiconductors of Si are on the order of $-1$ to $-100$.

Based on the foregoing explanation, a first embodiment of the invention is explained below. Taken as the first embodiment is a complex dielectric film of a serial-parallel model as shown in FIG. 4. As already explained, the effective dielectric constant $\kappa$ of a serial-parallel model formed between the conductors 11 and 12 is expressed by Equation (2). Here are used an insulator having a positive dielectric constant $\kappa_1$ as the element material 13, a semiconductor having a negative dielectric constant $\kappa_2$, such as doped silicon (Si), as the element material 14.

In order that $\kappa$ in Equation (2) be zero, that is, $\kappa = 0$, $$\phi = (2\kappa_1 + \kappa_2)/2(\kappa_1 - \kappa_2) \quad (16)$$

and $\phi$ is positive. In the first embodiment, since $\kappa_1 > 0$ and $\kappa_2 < 0$, the denominator of Equation (16) is always positive, and requirements for a positive value of $\phi$s can be expressed by Equation (17) shown below.

$$2\kappa_1 + \kappa_2 > 0 \quad (17)$$

That is, among various combinations of element materials 13 and 14, only combinations satisfying $2\kappa_1 + \kappa_2 > 0$ can realize $\kappa = 0$.

TABLE 1

| MATERIALS | | WEIGHT DENSITY ρ (g/cm³) | ELECTRON DENSITY N/V (× 10²⁸ m⁻³) | WIGNER-SEITZ RADIUS (rₛ/aₒ) | PLASMA OSCILLATION FREQUENCY $\omega_p$ (× 10¹⁶ sec⁻¹) | MEAN FREE TIME τ (× 10¹⁴ sec) | $\omega_p\tau$ | $\kappa_{re}$ |
|---|---|---|---|---|---|---|---|---|
| METAL | Au | 19.32 | 5.91 | 3.01 | 1.37 | 2.91 | 399 | $-1.59 \times 10^5$ |
| | Ag | 10.50 | 5.86 | 3.02 | 1.37 | 4.04 | 553 | $-3.06 \times 10^5$ |
| | Cu | 8.96 | 8.49 | 2.67 | 1.64 | 2.71 | 444 | $-1.97 \times 10^5$ |
| | Al | 2.70 | 18.07 | 2.07 | 2.40 | 0.784 | 187 | $-3.50 \times 10^4$ |
| SEMI-METAL | Bi | 9.80 | $3 \times 10^{-5}$ | 175.2 | $3.09 \times 10^{-2}$ | 293.0 | 905 | $-8.19 \times 10^5$ |
| | Sb | 6.69 | $5 \times 10^{-3}$ | 31.8 | $1.26 \times 10^{-1}$ | 20.9 | 263 | $-6.91 \times 10^4$ |
| | C | 2.30 | $\sim 10^{-4}$ | 117 | $5.64 \times 10^{-2}$ | 7.1 | 40.0 | $-1.60 \times 10^3$ |
| SEMI-CONDUCTOR | Si | 2.42 | $1 (= 10^{22}$ cm⁻³) | 5.44 | 1.0 | 0.0567 | 5.7 | $-31.5$ |
| | | | $10^{-2}$ | 25.3 | $1.0 \times 10^{-1}$ | 1.25 | 12.5 | $-155$ |
| | | | $10^{-4}$ | 117 | $1.0 \times 10^{-2}$ | 4.54 | 4.53 | $-19.5$ |
| | | | $3 \times 10^{-6}$ | 377 | $1.7 \times 10^{-3}$ | 16.5 | 2.85 | $-7.1$ |
| | | | $10^{-6}$ | 544 | $1.0 \times 10^{-4}$ | 18.9 | 1.89 | $-2.6$ |
| | | | $10^{-8} (= 10^{14}$ cm⁻³) | 2526 | $1.0 \times 10^{-4}$ | 22.7 | 0.23 | — |

Values Of $\kappa_{re}$ in Table 1 were calculated by Equation (15) shown below because Equation (12) can be regarded approximately equivalent to Equation (15), estimating that the maximum frequency of future semiconductor integrated circuit devices will be around $10^{10}$ Hz.

$$\kappa_{re} = 1 - \omega_p^2\tau^2 \quad (15)$$

To enable plasma oscillation of a metal or a semi-metal in a semiconductor, the time before an electron collides with a crystal lattice, namely, the mean free time $\tau$, must be longer than the cycle of plasma oscillation $1/\omega_p$. That is, $\tau > 1/\omega_p$, or $\omega_p\tau > 1$, must be established. Table 1 shows that the metals and semi-metals sufficiently satisfy the relationship. In the semiconductor Si, plasma oscillation is possible even when the electron density is as low as $10^{24}$ cm⁻³ ($10^{18}$ cm⁻³). Since the plasma oscillation frequency $\omega_p$ satisfies the relation $\omega_p\tau > 1$, the real part $\kappa_{re}$ of the complex dielectric constant $\kappa$ is proved to be a negative value from Equation (15).

As explained above, dielectric constants of metals, semi-metals and semiconductors containing conduction electrons have been proved to exhibit negative values. As shown in The first embodiment not only realize $\kappa = 0$ by using an insulator having a positive dielectric constant $\kappa_1$ as the element material 13 and a semiconductor having a negative dielectric constant $\kappa_2$ as the element material 14 and by appropriately selecting the volume ratio $\phi$ of the semiconductor having the negative dielectric constant $\kappa_2$, but also can design and provide a complex dielectric film having any desired value of $\kappa$ by changing $\phi$. For example, the embodiment can provide a complex dielectric film having a low dielectri constant having an effective dielectric constant $\kappa$ not larger than 2 in absolute value, which is desired in technologies of the 0.18 μm rule generation.

The complex dielectric film according to the first embodiment is suitable for use as an insulation film between wiring layers in a semiconductor device or a semiconductor integrated circuit device, and can decrease the inter-wiring capacitance sufficiently low while maintaining reliable insulation between wiring layers. As a result, the embodiment can prevent delay of electric signals or interference between electric signals, and can improve the performance of semiconductor devices or semiconductor integrated circuit devices.

Figure 9:
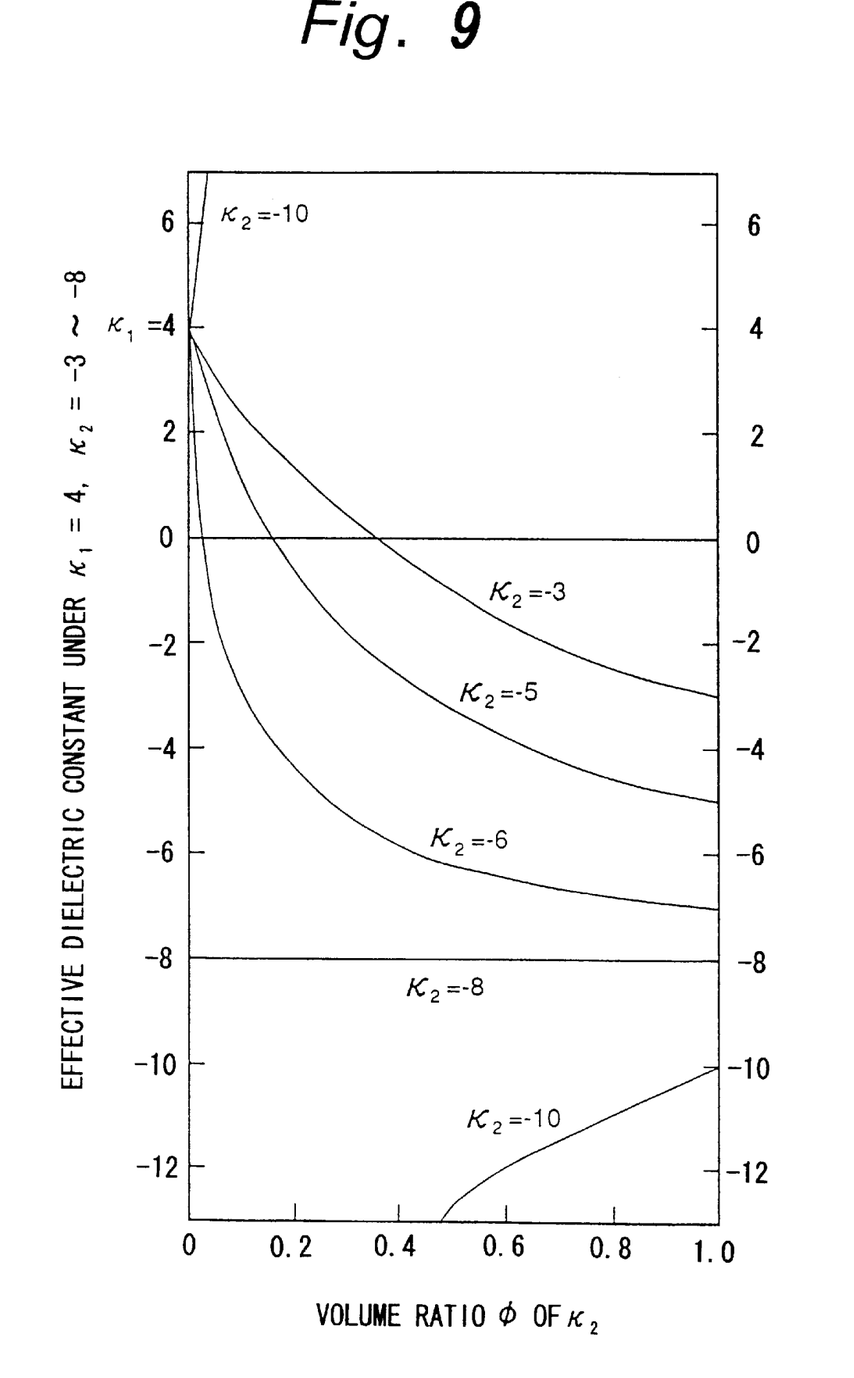
FIG. 9 is a schematic diagram showing relations between the effective dielectric constant κ of a complex dielectric film and the volume ratio φ of an element material having the dielectric constant $\kappa_2$ for various values of $\kappa_2$.

Next explained is a second embodiment of the invention. Here again, a complex dielectric film of a serial-parallel model is taken as the second embodiment. However, the second embodiment uses most typical $SiO_2(\kappa_1=4)$ as an insulator having a positive dielectric constant $\kappa_1$ for the element material 13. Thus, the dielectric constant $\kappa_2$ of the semiconductor used as the element material 14 must satisfy $\kappa_2>-8$ from Equation (17). Moreover, from Table 1, it must satisfy $\kappa_2<-3$ to meet the requirement $\omega_p\tau>1$ for promising plasma oscillation. FIG. 9 shows values of the effective dielectric constant of the complex dielectric film responsive to various values of the dielectric constant $\kappa_2$. It is known from FIG. 9 that a complex dielectric film having an effective dielectric constant $\kappa$ not larger than 2 can be obtained when $-8<\kappa_2<-3$ and $\phi<0.15$. It is also known that a complex dielectric film whose effective dielectric constant $\kappa$ is zero can be obtained under the following conditions.

$\kappa_2=-3$ and $\phi=0.35$
$\kappa_2=-5$ and $\phi=0.17$
$\kappa_2=-7$ and $\phi=0.045$ Also the second embodiment has the same advantages as those of the first embodiment.

Next explained is a third embodiment of the invention, taking a complex dielectric film of a serial-parallel model here again and using $SiO_2$ as an insulator having a positive dielectric constant $\kappa_1$ for the element material 13 and a semiconductor having a negative dielectric constant $\kappa_2$ as the element material 14, like the second embodiment. Although the real part $\kappa_{re}$ of the complex dielectric constant of the semiconductor is expressed Equation (15) as explained before, $\kappa_{re}$ can be determined with reference to the plasma oscillation frequency $\omega_p$ and the mean free time $\tau$, using Equation (15).

Table 1 shows values of the real part $\kappa_{re}$ of the complex dielectric constant $\kappa$. $\kappa_{re}$ sits in the range of $-8<\kappa_{re}<-3$ when the element material 14 is semiconductor Si and the electron density N/V is approximately in the following range:

$$1\times10^{22} \text{ m}^{-3}<N/V<3\times10 \text{ m}^{-3} \quad (18)$$

$$1\times10^{16} \text{ cm}^{-3}<N/V<3\times10^{16} \text{ cm}^{-3} \quad (19)$$

In these cases, plasma oscillation frequency $\omega_p$, mean free time $\tau$, and $\omega_p\tau$ exhibit the following values.

$0.998\times10^{13} \text{ sec}^{-1}<\omega_p<1.7\times10^{13} \text{ sec}^{-1}$
$1.89\times10^{-13} \text{ sec}>\tau>1.65\times10^{-3} \text{ sec}$
$1.89<\omega_p\tau<2.85$ In this manner, using $SiO_2$ as the element material 13 and using semiconductor Si having an electron density N/V in the range of Equation (18) or (19) as the element material 14, a complex dielectric film having a low dielectric constant whose effective dielectric constant $\kappa$ is not larger than 2 in absolute value can be obtained. It is also possible to obtain a complex dielectric film whose effective dielectric constant $\kappa$ is zero.

Also the third embodiment attains the same advantages as those of the first embodiment.

Next explained is a fourth embodiment of the invention. In the first, second and third embodiments, the element material 14 forming the complex dielectric film is defined by its volume ratio $\phi$. As long as the element material 14 maintains the determined volume ratio $\phi$, it may be made in any form, either particles, fine particles, ultra-fine particles, clusters, molecules, or the like. Usable as the element material 14 are metals, semi-metals, semiconductors such as silicon, germanium or compound semiconductors, inorganic and organic materials containing conduction electrons, such as organic molecules and organic polymers.

Although the second and third embodiments has been explained as using most typical $SiO_2$ as the element material 13 forming the complex dielectric film, also usable are silicon nitride ($Si_3N_4$), oxy-nitride silicon (SiON), aluminum nitride ($Al_2O_3$) and titanium oxide.

Next explained is a fifth embodiment of the invention, taking a complex dielectric film of a parallel model as shown in FIG. 5. As explained before, the effective dielectric constant $\kappa$ of the complex dielectric film of a parallel mode. is expressed by Equation (3). However, here are used an insulator having a positive dielectric constant $\kappa_1$ as the element material 13 and a metal or a semi-metal having a negative large dielectric constant $\kappa_2$ as the element material 14. In this case, when $\phi$ takes the value expressed by Equation (20), K=0 is realized.

$$\phi_2=\kappa_1/(\kappa_1-\kappa_2) \quad (20)$$

Since $\phi$ is $\phi_2$ when $\kappa=0$, the value of $\kappa$ can be made sufficiently small by selecting the value of $\phi$ near $\phi_2$. For example, when $\phi$ is $\phi_3$ expressed by Equation (21), the absolute value $|\kappa|$ of the effective dielectric constant $\kappa$ can be held at 2 or less.

$$(2+\kappa_1)/(\kappa_1-\kappa_2)>\phi_3>(\kappa_1-2)/(\kappa_1-\kappa_2) \quad (21)$$

Figure 10:
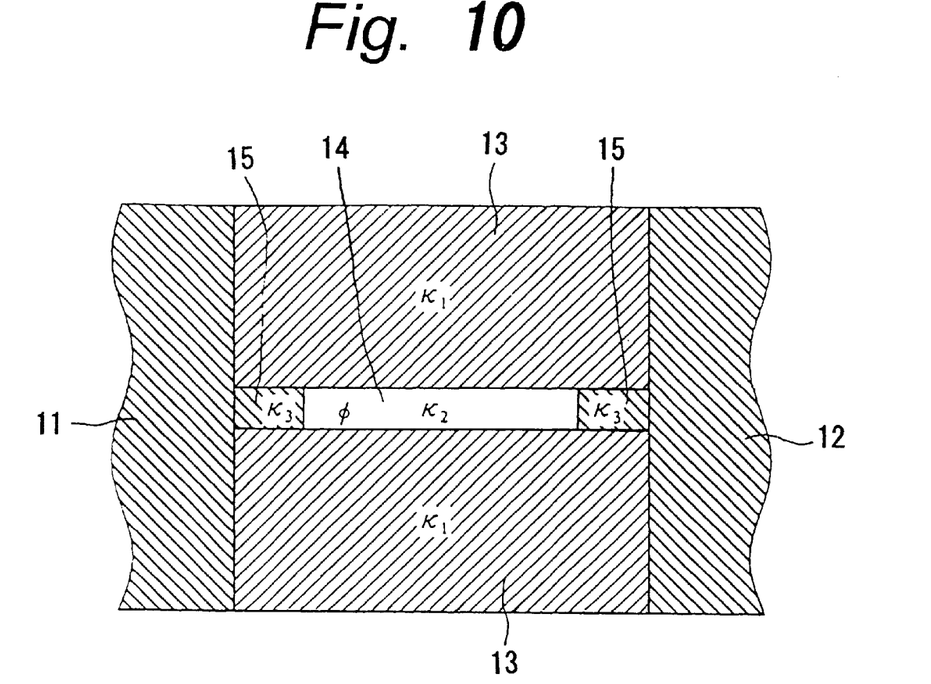
FIG. 10 is a cross-sectional view showing an arrangement actually using the complex dielectric film according to a fifth embodiment of the invention.
Figure 11:
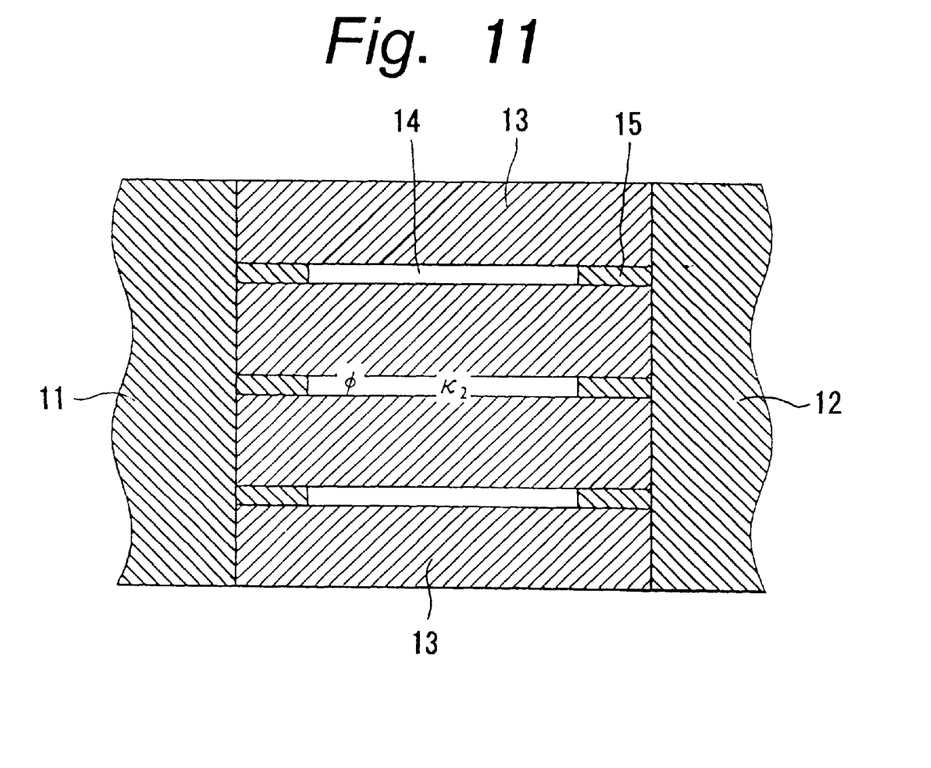
FIG. 11 is a cross-sectional view showing another arrangement actually using the complex dielectric film according to the fifth embodiment of the invention.

Since the element material 14 used in the fifth embodiment is a metal or a semi-metal, it is practically necessary to replace the parallel model shown in FIG. 5 by another structure as shown in FIGS. 8 and 9, for example, in order to prevent short-circuit between the conductors 11 and 12. In this case, the element material 14 of a metal or a semi-metal is made in form of a thin film. A single layer of the thin-film element material 14 is used in the example of FIG. 10, and a plurality of layers (three layers, here) of the thin-film element material 14 are provided in the example of FIG. 11. Regions 15 having the dielectric constant $\kappa_3$ in FIGS. 10 and 11 are made of an insulator, typically, $SiO_2$. In FIGS. 10 and 11, the element material 14 having the electric constant $\kappa_2$ may be divided into any number of sections to an extent where its volume ratio $\phi$ satisfies $\phi_2$ and $\phi_3$ in Equations (20) and (21). Here again, it may be made in any form, either particles, fine particles, ultra-fine particles, clusters, molecules, or the like, and the same effects are obtained.

By using an insulator having a positive dielectric constant $\kappa_1$ as the element material 13, a metal or a semi-metal having a negative dielectric constant $\kappa_2$ as the element material 14, and by determining the volume ratio $\phi$ of the semiconductor having a negative dielectric constant $\kappa_2$ to satisfy Equations (20) and (21), the fifth embodiment can realize $\kappa=0$, and also can design and provide a complex dielectric film having a desired value of $\kappa$ by changing $\phi$. For example, the embodiment can provide a complex dielectric film having a low dielectric constant having an effective dielectric constant $\kappa$ not larger than 2 in absolute value, which is desired in technologies of the 0.18 $\mu$m rule generation. Accordingly, the embodiment can realize a high-performance semiconductor device or semiconductor integrated circuit device like those explained in the description of the first embodiment.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the fifth embodiment has been described as using a metal or a semi-metal having a negative large dielectric constant $\kappa_1$ as the element material 14 forming the complex dielectric film, the same results are obtained by using a semiconductor, alloy, or organic material containing conduction electrons in lieu of the metal or semi-metal.

As explained above, the invention can provide complex dielectric films having sufficiently small effective dielectric constants as small as 0 to 2, for example, in absolute value, while maintaining reliable insulation between conductors, by using an insulator and a non-insulator to form the complex dielectric films and by selecting appropriate values of the volume ratio of the non-insulator.

The invention also realizes semiconductor devices including a complex dielectric film having a sufficiently small effective dielectric constant as small as 0 to 2, for example, in absolute value, while maintaining reliable insulation between conductors, and therefore decreasing the capacitance inter-conductor capacitance, such as inter-wiring capacitance, sufficiently small, by using an insulator and a non-insulator to form the complex dielectric film.

What is claimed is:

1. A complex dielectric film formed between a plurality of conductors comprising:
   an insulator having a positive dielectric constant; and
   a non-insulator having a negative dielectric constant, sizes of the insulator and non-insulator being selected such that the non-insulator has a predetermined volume ratio relative to the insulator,
   wherein the insulator and non-insulator form a composite structure having a desired effective dielectric constant based on the positive and negative dielectric constant and the volume ratio such that the composite structure is at least substantially resistant to the conduction of electrons.

2. The complex dielectric film according to claim 1 wherein said insulator and said non-insulator are aligned in series between said conductors.

3. The complex dielectric film according to claim 1 wherein said non-insulator is provided in said insulator.

4. The complex dielectric film according to claim 1 wherein said insulator and said non-insulator are aligned in parallel between said conductors.

5. The complex dielectric film according to claim 1 wherein said non-insulator is a metal or a semi-metal.

6. The complex dielectric film according to claim 5 wherein said metal or semi-metal is in form of a thin film.

7. The complex dielectric film according to claim 5 wherein said metal or semi-metal is in form of a thin film making a superlattice structure with said insulator in form of a film.

8. The complex dielectric film according to claim 5 wherein said metal or semi-metal is distributed in form of particles in said insulator.

9. The complex dielectric film according to claim 5 wherein said metal or semi-metal is distributed in form of clusters in said insulator.

10. The complex dielectric film according to claim 1 wherein said non-insulator is a semiconductor.

11. The complex dielectric film according to claim 10 wherein said semiconductor is in form of a thin film.

12. The complex dielectric film according to claim 10 wherein said semiconductor is in form of a thin film making a superlattice structure with said insulator in form of a film.

13. The complex dielectric film according to claim 10 wherein said semiconductor is distributed in form of particles in said insulator.

14. The complex dielectric film according to claim 10 wherein said semiconductor is distributed in form of clusters in said insulator.

15. The complex dielectric film according to claim 1 wherein said non-insulator is an organic material containing conduction electrons.

16. The complex dielectric film according to claim 15 wherein said molecules or polymers make a thin film.

17. The complex dielectric film according to claim 15 wherein said molecules or polymers make a thin film forming a superlattice structure with said insulator in form of a film.

18. The complex dielectric film according to claim 15 wherein said molecules or polymers are distributed in form of particles in said insulator.

19. The complex dielectric film according to claim 15 wherein said molecules or polymers are distributed in form of molecules or polymers in said insulator.

20. The complex dielectric film according to claim 1 wherein the effective dielectric constant is not larger than 2 in absolute value.

21. A semiconductor device comprising a composite dielectric film provided between a plurality of conductors:
   wherein said composite dielectric film is comprised of an insulator having a positive dielectric constant and a non-insulator having a negative dielectric constant, sizes of the insulator and non-insulator being selected such that the non-insulator has a predetermined volume ratio relative to the insulator, and
   wherein the composite dielectric film has a desired effective dielectric constant based on the positive and negative dielectric constants and the volume ratio such that the composite dielectric film is at least substantially resistant to the conduction of electrons through the composite dielectric film.

22. The semiconductor device according to claim 21 wherein said insulator and said non-insulator are arranged in series between said conductors.

23. The semiconductor device according to claim 21 wherein said non-insulator is provided in said insulator.

24. The semiconductor device according to claim 21 wherein said insulator and said non-insulator are arranged in parallel between said conductors.

25. The semiconductor device according to claim 21 wherein said non-insulator is a metal or a semi-metal.

26. The semiconductor device according to claim 25 wherein said metal or semi-metal forms a thin film.

27. The semiconductor device according to claim 25 wherein said metal or semi-metal forms a thin film making a superlattice structure with said insulator in form of a film.

28. The semiconductor device according to claim 25 wherein said metal or semi-metal is distributed in form of particles in said insulator.

29. The semiconductor device according to claim 25 wherein said metal or semi-metal is distributed in form of clusters in said insulator.

30. The semiconductor device according to claim 21 wherein said non-insulator is a semiconductor.

31. The semiconductor device according to claim 30 wherein said semiconductor forms a thin film.

32. The semiconductor device according to claim 30 wherein said semiconductor forms a thin film making a superlattice structure with said insulator in form of a film.

33. The semiconductor device according to claim 30 wherein said semiconductor is distributed in form of particles in said insulator.

34. The semiconductor device according to claim 30 wherein said semiconductor is distributed in form of clusters in said insulator.

35. The semiconductor device according to claim 21 wherein said non-insulator is an organic material containing conduction electrons.

36. The semiconductor device according to claim 35 wherein said organic material forms a thin film.

37. The semiconductor device according to claim 35 wherein said organic material makes a thin film which forms a superlattice structure with said insulator in form of a film.

38. The semiconductor device according to claim 35 wherein said organic material is distributed in form of particles in said insulator.

39. The semiconductor device according to claim 35 wherein said organic material is distributed in form of molecules in said insulator.

40. A semiconductor device comprising:

first and second wiring layers separated by a composite dielectric layer; and wherein said composite dielectric layer is comprised of an insulator having a positive dielectric constant and a non-insulator having a negative dielectric constant, sizes of the insulator and non-insulator being selected such that the non-insulator has a predetermined volume ratio relative to the insulator, and wherein said composite dielectric layer has a desired effective dielectric constant based on the positive and negative dielectric constants and the volume ratio such that the composite dielectric layer is at least substantially resistant to the conduction of electrons through the composite dielectric layer.

\* \* \* \* \*